(12) United States Patent
Anderson et al.

(10) Patent No.: US 11,781,564 B1
(45) Date of Patent: Oct. 10, 2023

(54) FAN HANDLE

(71) Applicant: ZT GROUP INT'L, INC., Secaucus, NJ (US)

(72) Inventors: Paul Harold Anderson, Leander, TX (US); Alan Doerr, Tomball, TX (US); Sarah Kaus, Austin, TX (US)

(73) Assignee: ZT GROUP INT'L, INC., Secaucus, NJ (US)

( * ) Notice: Subject to any disclaimer, the term of this patent is extended or adjusted under 35 U.S.C. 154(b) by 0 days.

(21) Appl. No.: 17/934,224

(22) Filed: Sep. 22, 2022

(51) Int. Cl.
 *F04D 29/60* (2006.01)
 *G06F 1/20* (2006.01)
 *H05K 7/20* (2006.01)
 *F04D 19/00* (2006.01)

(52) U.S. Cl.
 CPC ......... *F04D 29/602* (2013.01); *F04D 19/002* (2013.01); *G06F 1/20* (2013.01); *H05K 7/20172* (2013.01)

(58) Field of Classification Search
 CPC ......... F04D 29/602; F04D 19/002; G06F 1/20
 See application file for complete search history.

(56) References Cited

U.S. PATENT DOCUMENTS 6,040,981 A * 3/2000 Schmitt ............... G06F 1/18
361/679.48

* cited by examiner

*Primary Examiner* — Brian O Peters
(74) *Attorney, Agent, or Firm* — POLSINELLI PC (57) ABSTRACT

A fan handle is operable to be coupled to a fan. The fan handle includes a first sheet and a second sheet. The first sheet has first apertures operable to receive fasteners to couple a fan guard with a first side of the fan. The first sheet forms a slot. The second sheet has second apertures operable to receive fasteners to couple a fan guard with a second side of the fan. The second sheet forms shoulders from which an extension portion extends. The extension portion is received in the slot of the first sheet. In a retracted configuration, the first sheet and the second sheet are substantially flush such that the shoulders abut against the first sheet. In an extended configuration, the extension portion is partially withdrawn from the slot such that the first sheet and the second sheet are curved and coupled with one another.

20 Claims, 6 Drawing Sheets

FAN HANDLE

FIELD

The present disclosure relates generally to a fan handle operable to be retrofit to a fan installed in a computing system.

BACKGROUND

Computing systems such as modular servers and/or information handling systems, include cooling fans to cool off hot computing components. The computing system can have many computing components in close proximity to each other and to the cooling fans. The cooling fans must be able to be removed from the computing system, but with the close proximity of computing components, grasping the cooling fan(s) for removal can be very difficult. Also, the computing components within the computing system may be emitting heat at high temperatures, which can lead to burn injuries to users trying to remove the cooling fan(s).

BRIEF DESCRIPTION OF THE DRAWINGS

Implementations of the present technology will now be described, by way of example only, with reference to the attached figures, wherein.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

Disclosed herein is a fan handle operable to be retrofit to a fan in a computing system. The computing components in a computing system can be in very close proximity to the fan, and in some examples, the computing system may include a plurality of fans provided in a row in close proximity to one another. As the computing components may emit heat at very high temperatures, contact with the computing components may cause burn injuries. Additionally, given the close proximity of the fan with computing components and/or other fans, it can be difficult to grasp the fan for removal.

The fan handle can be retrofit to the fan so that no changes or modifications to the fan and/or the computing system is needed. The fan handle can transition between an extended configuration and a retracted configuration. In the extended configuration, the fan handle creates a gap between the fan handle and the top side of the fan. Accordingly, the fan handle can be easily grasped to remove the fan without contacting the computing components. In the retracted configuration, the fan handle can be substantially flush and lay substantially flat along the top side of the fan. Accordingly, the fan handle can fit in the tight-spaced constraints of the computing system.

Figure 1:
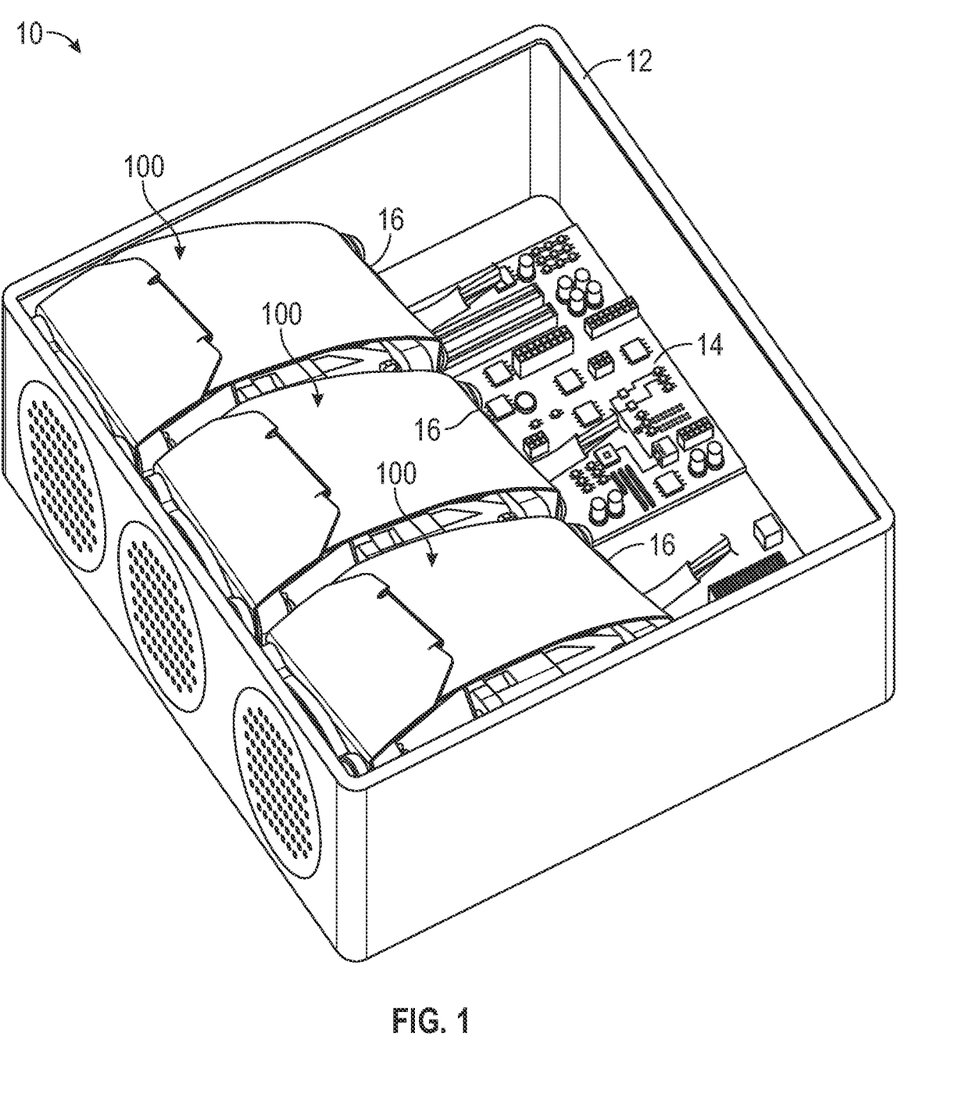
FIG. 1 is a perspective view of a computing system with a plurality of fans having a fan handle.

The disclosure now turns to FIG. 1, which illustrates an example of a computing system 10 to be used, for example, in a modular server and/or information handling system. The computing system 10 can include a body 12 operable to contain a plurality of computing components 14, such as a motherboard, one or more hard drives (not shown), power supply (not shown), riser card(s), etc.

One or more fans 16 can be disposed in the body 12. In some examples, the fans 16 can be in fluidic communication with the computing components 14 in the body 12 such that the fans 16 can provide air flow across the computing components 14. The fans 16 can help manage the temperature(s) of the computing components 14, for example to keep the temperature of the computing components 14 below a predetermined threshold. Accordingly, with the one or more fans 16, failure of the computing components 14 can be reduced and/or prevented.

The fans 16 must be able to be removed from the computing system 10. However, as the fans 16 may be in close proximity (e.g., within 15 millimeters) to the computing components 14, grasping the fan(s) 16 for removal can be very difficult. Also, the computing components 14 within the computing system 10 may be emitting heat at high temperatures, which can lead to burn injuries to users trying to remove the fan(s) 16. Conventionally, it would be very difficult for a user to remove the fans 16. For example, the fans 16 may be in close proximity to the computing components 14. In some examples, as illustrated in FIG. 1, the computing system 10 may include a plurality of fans 16 situated in a row without much space between each fan 16 to grasp a fan 16 for removal.

To assist in removal of the fan(s) 16, each of the fans 16 can include a fan handle 100. The fan handle 100 can be grasped by the user to lift the fan 16 during removal. With the fan handle 100, the user can avoid contact with the computing components 14 and avoid burn injury. Additionally, the user can easily grasp the fan handle 100 instead of struggling to grasp the fan 16 itself.

The fan handle 100 can be operable to be retrofit to the fans 16 that are conventionally provided in a computing system 10. The fan handle 100 can be coupled with the fan 16 without the need to change or modify the existing fans 16. Similarly, the computing system 10 does not need to be changed or modified to fit the fans 16 with the fan handles 100.

Figure 2A:
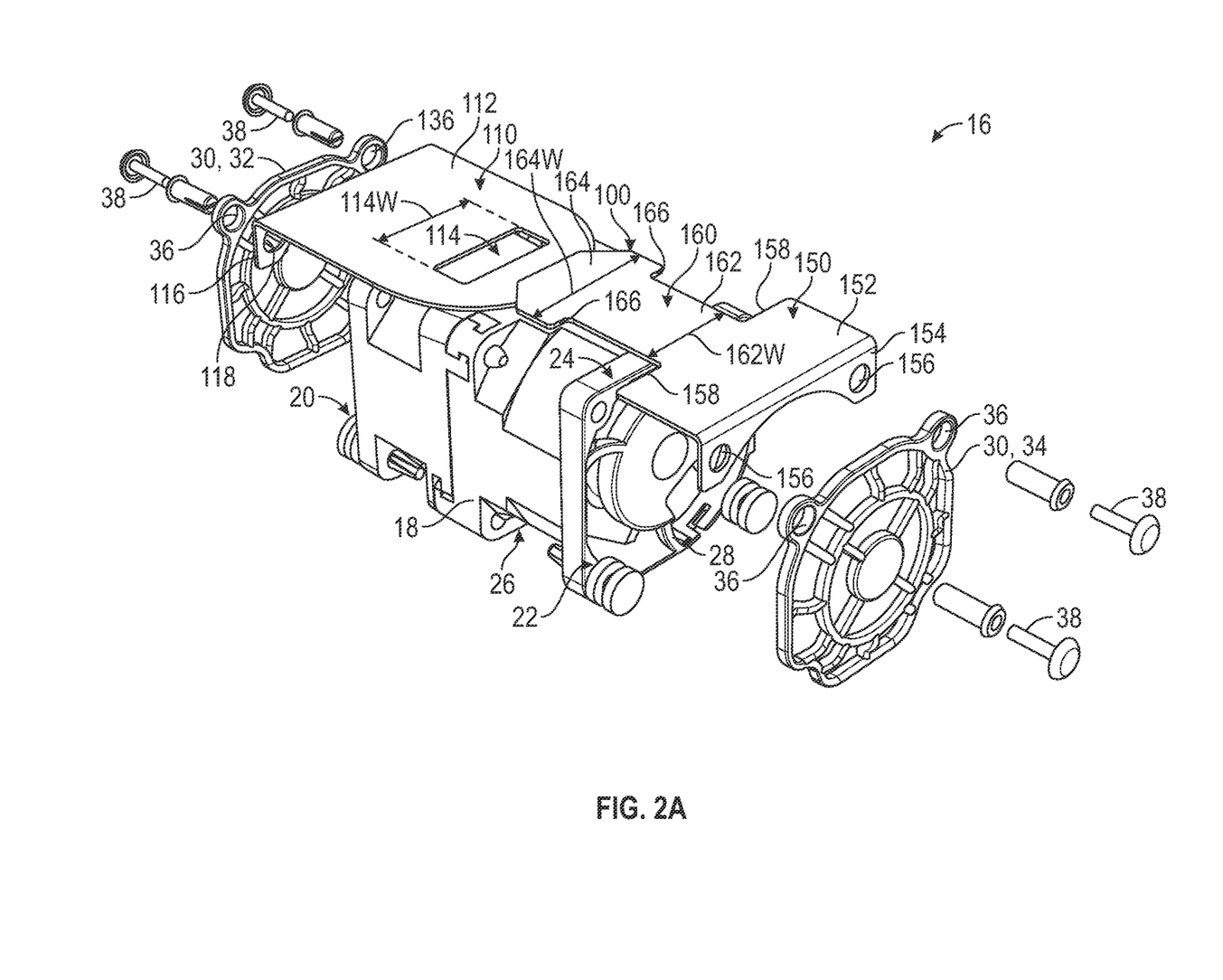
FIG. 2A is an exploded, perspective view of a fan with a fan handle.
Figure 2B:
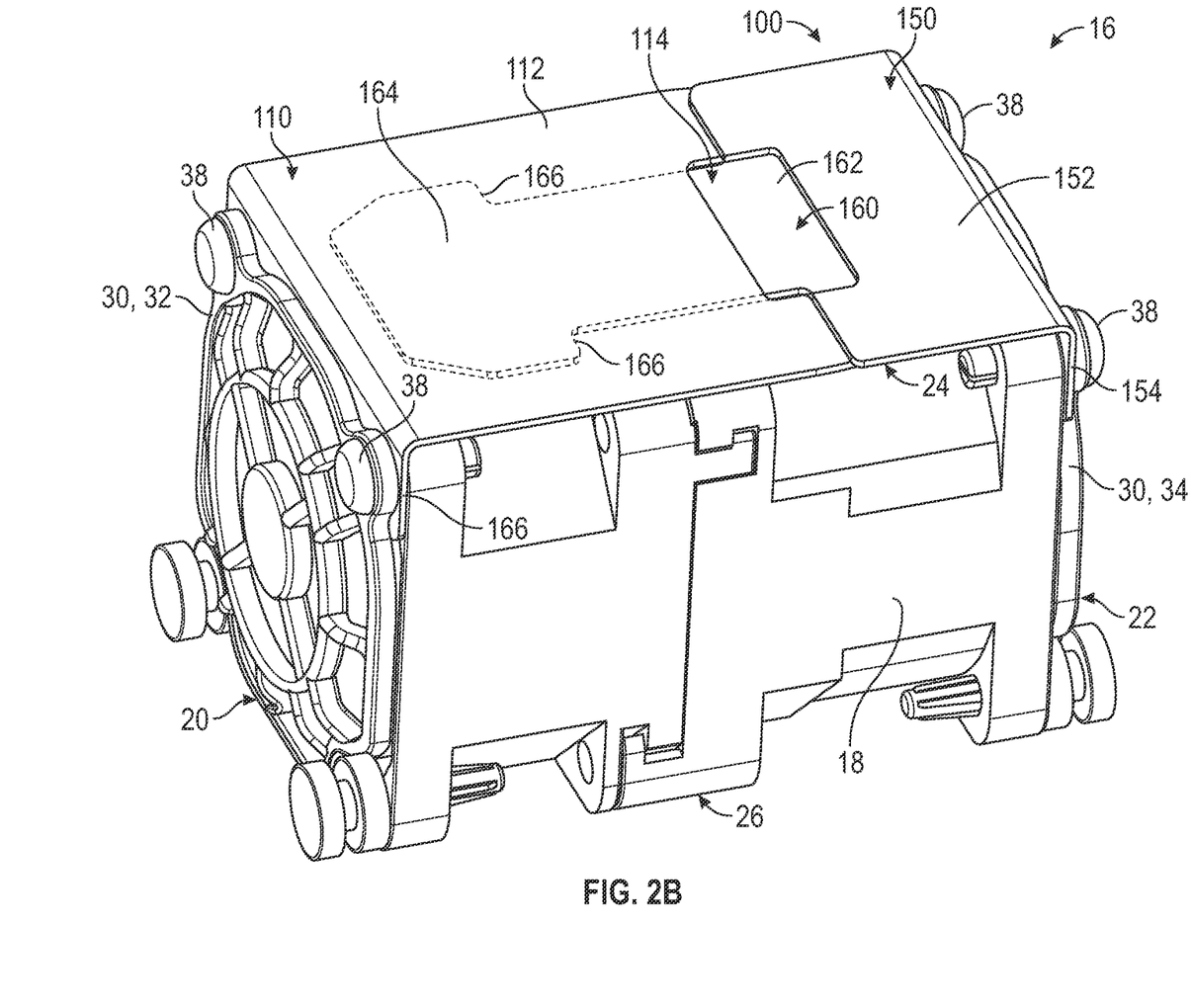
FIG. 2B is an assembled, perspective view of the fan of FIG. 2A.
Figure 3:
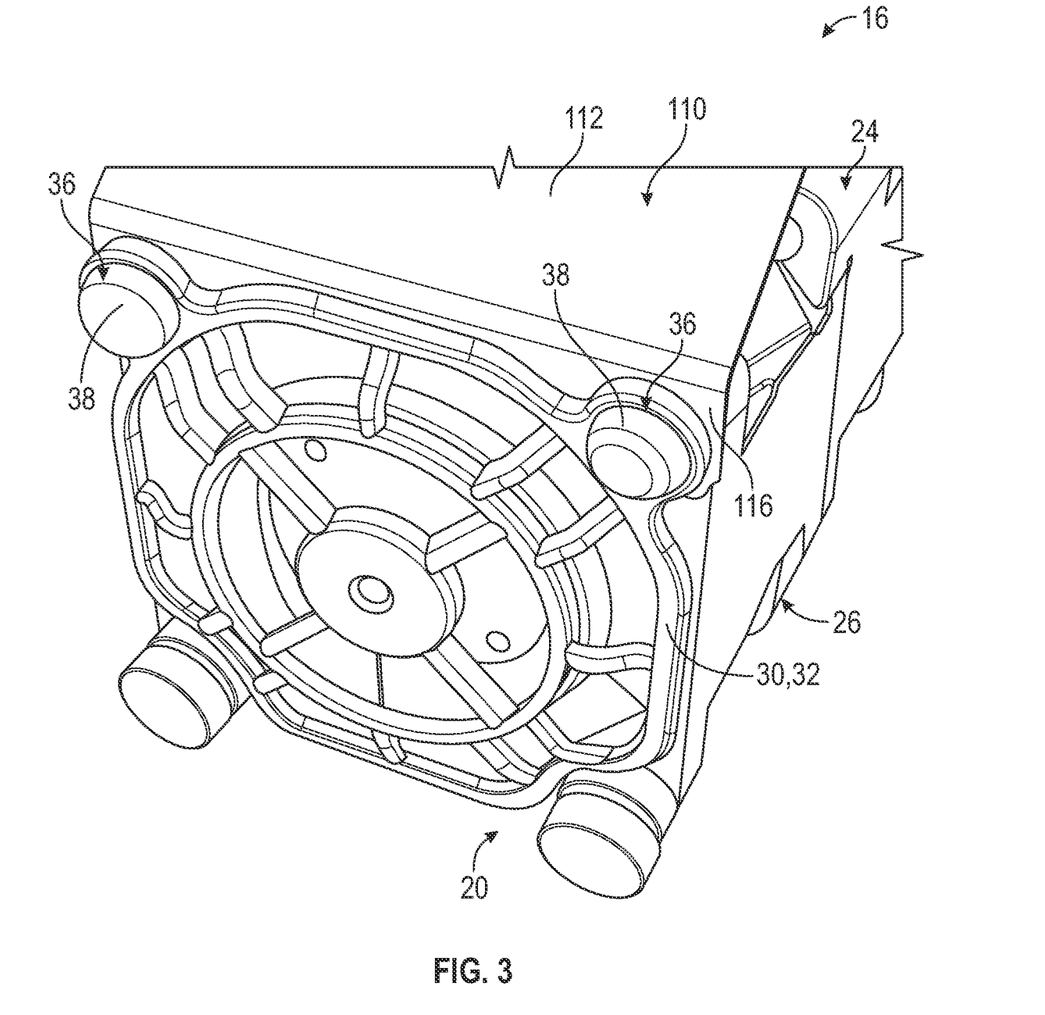
FIG. 3 is an enlarged, perspective view of the fan.

FIG. 2A illustrates the fan 16 with a fan handle 100 in an exploded view, FIG. 2B illustrates the fan 16 with the fan handle 100 in an assembled view, and FIG. 3 illustrates an enlarged view of a portion of the fan 16 with the fan handle 100 coupled thereto.

As shown in FIG. 2A, the fan 16 can include a housing 18 having a first side 20 and a second side 22 opposite the first side 20. The housing 18 also has a bottom side 26 and an opposing top side 24. The fan 16 can be configured such that fan 16 is sitting on the bottom side 26, and the top side 24 is exposed to the top of the body 12 of the computing system 10. The fan 16 can include a plurality of fan blades 28 disposed within the housing 18. The fan blades 28 can be operable to rotate to create air flow across the housing 18 and through the computing system 10.

A first fan guard 32 can be coupled to the first side 20 of the housing 18, and a second fan guard 34 can be coupled to the second side 22 of the housing 18. The fan guards 30 are operable to prevent items such as fingers from reaching into the housing 18 and the fan blades 28. Accordingly, the fan guards 30 protect the fan blades 28 and the inner workings of the fan 16. The fan guards 30 can be coupled with the housing 18 via fasteners 38. The fasteners 38 can include screws, pins, or any other suitable mechanism to couple the fan guards 30 with the housing 18. The fan guards 30 can include corresponding apertures 36 operable to receive the fasteners 38. The fasteners 38 can be operable to be inserted through the apertures 36 and into the housing 18 to couple the fan guards 30 with the housing 18. The combination of apertures 36 and fasteners 38 may be utilized in many conventional fans 16 to couple the fan guards 30 with the housing 18 of the fan 16.

To retrofit the fan handle 100 with the fan 16, the fan handle 100 can be coupled with the housing 18 of the fan 16 via the fasteners 38. The fan handle 100 can include coupling sections 116, 154 that are operable to be coupled with the fan 16. The coupling section 116 can correspond with the first side 20 of the fan 16, and the coupling section 154 can correspond with the second side 22 of the fan 16. The coupling sections 116, 154 can include handle apertures 118, 156 that correspond with and align with the apertures 36 of the fan guards 30. The fasteners 38 can be received by and inserted through the apertures 36 of the fan guards 30 and the handle apertures 118, 156 of the fan handle 100 and into the housing 18 to couple the fan guards 30 and the fan handle 100 with the housing 18 of the fan 16. Accordingly, the fan handle 100 can be retrofit to couple with the fan 16 without any changes or modifications needed to conventional fans 16. In at least one example, as illustrated in FIG. 3, the coupling sections 116, 154 can be disposed between the fan guards 30 and the housing 18 of the fan 16. In some examples, the fan guards 30 can be disposed between the coupling sections 116, 154 and the housing 18 of the fan 16.

The fan handle 100 can include a first sheet 110 and a second sheet 150. In at least one example, the first sheet 110 and the second sheet 150 are operable to be coupled with the fan 16 such that the fan handle 100 is operable to be retrofit to the fan 16. The first sheet 110 can form the coupling section 116 and the first handle apertures 118 operable to receive corresponding fasteners 38 operable to couple the fan guard 32 with the first side 20 of the fan 16. The second sheet 150 can form the coupling section 154 and the second handle apertures 156 operable to receive corresponding fasteners 38 operable to couple the fan guard 32 with the second side 22 of the fan 16. Accordingly, the first sheet 110 can be coupled with the first side 20 of the fan 16, and the second sheet 150 can be coupled with the second side 22 of the fan 16.

Figure 4A:
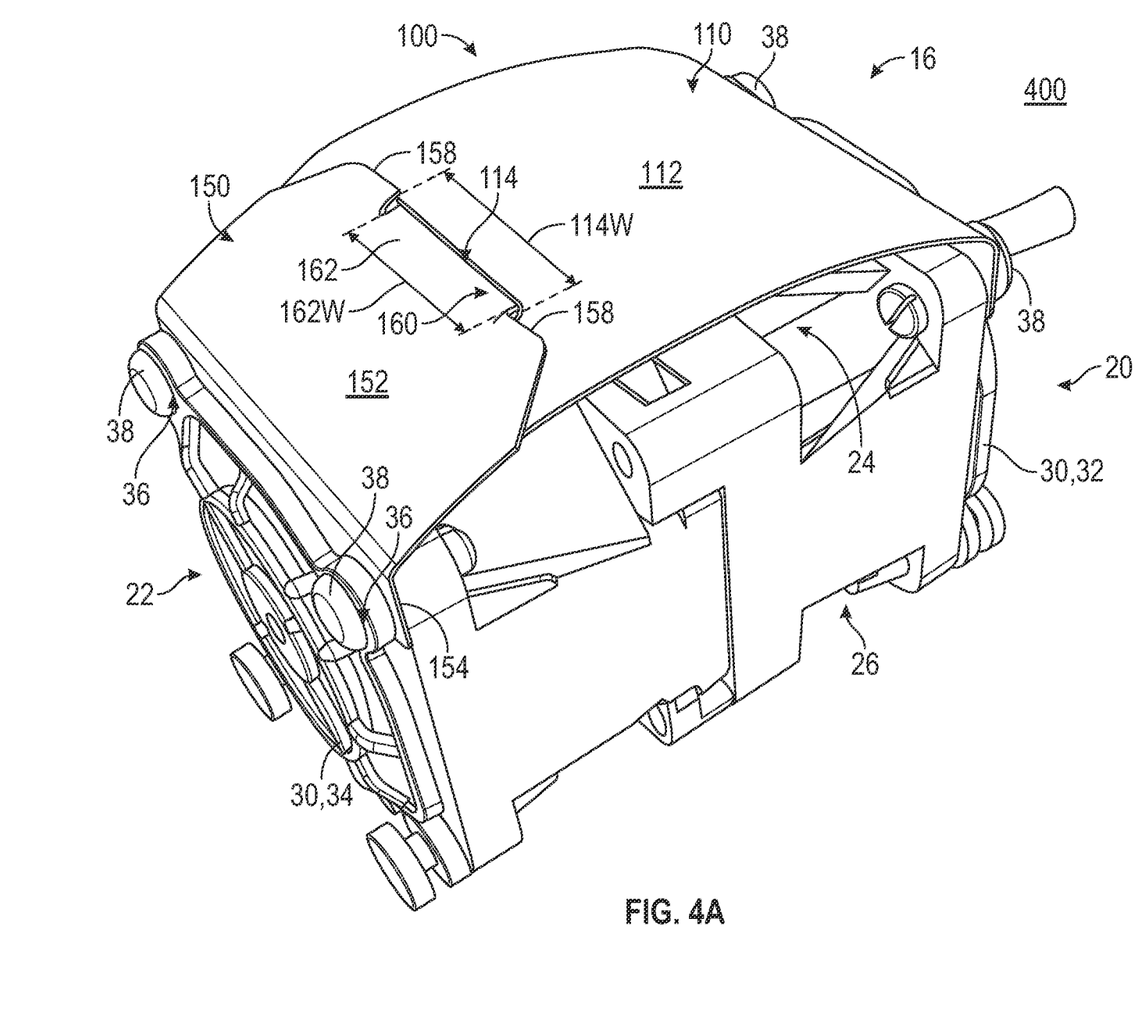
FIG. 4A is a perspective view of the fan with the fan handle in a retracted configuration.
Figure 4B:
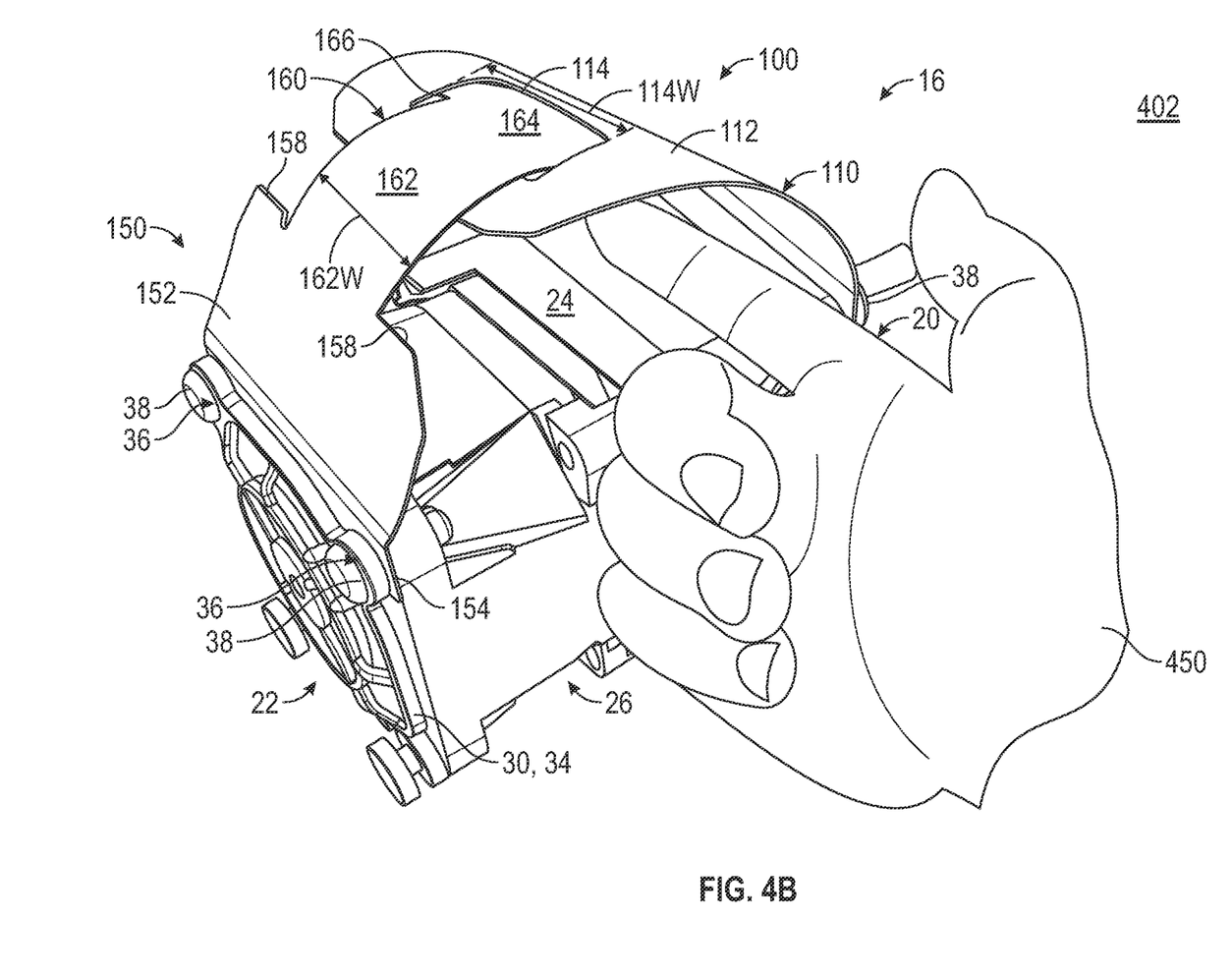
FIG. 4B is a perspective view of the fan of FIG. 4A with the fan handle in an extended configuration.

The first sheet 110 can include a flex body 112 operable to bend when transitioning to an extended configuration (see FIG. 4B). The flex body 112 can form a slot 114 having a slot width 114W.

The second sheet 150 can include a base portion 152, an extension portion 160, and a head 164. The second sheet 150 is operable to bend when transitioning to the extended configuration (see FIG. 4B).

The base portion 152 can be connected to the coupling section 154. The extension portion 160 extends from the base portion 152 opposite the coupling section 154. The base portion 152 of the second sheet 150 is configured to form shoulders 158 from which the extension portion 160 extends. The extension portion 160 includes a body 162 having a body width 162W. The body width 162W is less than the width of the base portion 152, thus forming the shoulders 158. In at least one example, the shoulders 158 can extend laterally from the extension portion 160 to form the base portion 152. The extension portion 160 is operable to be received in the slot 114 of the first sheet 110. In some examples, the extension portion 160 is operable to slide within the slot 114 of the first sheet 110.

The head 164 extends from and/or is coupled with the extension portion 160. The head 164 can extend from and/or be coupled with the extension portion 160 opposite the base portion 152. The head 164 can have a head width 164W greater than the body width 162W of the body 162 of the extension portion 160. Accordingly, the head 164 can form head shoulders 166 adjacent to the extension portion 160. In at least one example, the head shoulders 166 can extend laterally from the extension portion 160 to form the head 164.

In at least one example, the head width 164W can be greater than the slot width 114W. While the extension portion 160 of the second sheet 150 is slidably received in the slot 114 of the first sheet 110, the head 164 prevents the second sheet 150 from being separated from the first sheet 110. The head width 164W being greater than the slot width 114W prevents the extension portion 160 and subsequently the second sheet 150 from fully being withdrawn from the slot 114. Accordingly, the first sheet 110 is coupled with the second sheet 150.

In at least one example, the first sheet 110 and/or the second sheet 150 can be fabricated out of polypropylene. In at least one example, the first sheet 110 and/or the second sheet 150 can be fabricated out of a flame retardant material, for example rated UL 94 V-0. Accordingly, the fan handle 100 can be manufactured at low cost and can be quickly fabricated.

As shown in FIGS. 2B and 4A, the fan handle 100 is in a retracted configuration 400. In the retracted configuration 400, the first sheet 110 and the second sheet 150 are operable to be substantially flush with the housing 18 of the fan 16 such that the shoulders 158 abut against the flex body 112 of the first sheet 110. In at least one example, in the retracted configuration 400, the base portion 152 of the second sheet 150 can abut against the flex body 112 of the first sheet 110. As the shoulders 158 and the base portion 152 have a width greater than the body width 162W of the extension portion 160, the abutment of the shoulders 158 with the flex body 112 prevents further movement of the first sheet 100 in relation to the second sheet 150.

In the retracted configuration 400, the first sheet 110 and the second sheet 150 are substantially flush with the top side 24 of the housing 18 of the fan 16. In at least one example, the first sheet 110 and the second sheet 150 lay substantially flat against the top side 24 of the housing 18 of the fan 16. Accordingly, the fan handle 100 can fit in the tight-spaced constraints of the computing system 10 without needing to modify or change the computing system 10.

FIG. 4B shows the fan handle 100 being transitioned to an extended configuration 402. As shown in FIG. 4B, the fan handle 100 can be transitioned to the extended configuration 402 via one hand 450. In at least one example, a single finger can be utilized to transition the fan handle 100 to the extended configuration 402. The first sheet 110 and/or the second sheet 150 can be lifted upwards away from the top side 24 of the housing 18 of the fan 16. As the first sheet 110 and/or the second sheet 150 is lifted, the extension portion 160 is partially withdrawn from the slot 114 such that the first sheet 110 and the second sheet 150 are curved and coupled with one another. As the extension portion 160 slides out from the slot 114, the head 164 having a head width 164W greater than the slot width 114W prevents the second sheet 150 from fully detaching from the first sheet 110. In at least one example, the head shoulders 166 abut against the flex body 112 of the first sheet 110. Accordingly, the first sheet 110 remains coupled with the second sheet 150 and is operable to withstand the force from lifting the fan 16 out of the computing system 10.

As the first sheet 110 and the second sheet 150 are lifted, the first sheet 110 and the second sheet 150 curve upward to form a gap between the fan handle 100 and the top side 24 of the fan 16. At least a portion of the user's hand 450 can fit within the gap so that the fan handle 100 can be grasped to lift and remove the fan 16 from the body 12 of the computing system 10 without contact with the computing components 14. Accordingly, burn injuries can be prevented, and/or the fan 16 can be more easily grasped to be removed.

While the disclosure discusses utilizing a user's hand 450 to manipulate and/or lift the fan handle 100, other objects such as rods, hooks, or levers can be utilized without deviating from the scope of the disclosure.

To transition the fan handle 100 from the extended configuration 402 to the retracted configuration 400, the first sheet 110 and/or the second sheet 150 can be pushed down towards the top side 24 of the housing 18 of the fan 16. The fan handle 100 can be pushed towards the housing 18 of the fan 16 via a finger or other objects such as rods, hooks, or levers. In some examples, the fan handle 100 can be pushed towards the housing 18 of the fan 16 by a lid of the body 12 of the computing system 10 when the lid is closed to assemble the body 12 of the computing system 10. In transitioning to the retracted configuration 400, the body 162 of the extension portion 160 slides further into the slot 114. In some examples, the extension portion 160 can slide into the slot 114 until the shoulders 158 of the base portion 152 abut against the flex body 112 of the first sheet 110. The fan handle 100 can be pushed down until the first sheet 110 and the second sheet 150 are substantially flush or laying flat with the top side 24 of the housing 18 of the fan 16. Accordingly, the fan handle 100 does not take up any unnecessary space within the computing system 10. In some examples, the fan handle 100 can be retrofit to the fan 16 such that the fan 16 and the computing system 10 do not need any changes or modifications for the fan handle 100 to fit within the computing system 10.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A fan handle operable to be coupled to a fan, the fan handle comprising:
   a first sheet having one or more first apertures operable to receive corresponding one or more fasteners operable to couple a first fan guard with a first side of a fan, wherein the first sheet forms a slot; and a second sheet having one or more second apertures operable to receive corresponding one or more fasteners operable to couple a second fan guard with a second side of the fan opposite the first side, wherein the second sheet forms shoulders from which an extension portion extends, wherein the extension portion is operable to be received in the slot of the first sheet,
   wherein, in a retracted configuration, the first sheet and the second sheet are operable to be substantially flush such that the shoulders abut against the first sheet,
   wherein, in an extended configuration, the extension portion is partially withdrawn from the slot such that the first sheet and the second sheet are curved and coupled with one another.

2. The fan handle of claim 1, wherein the extension portion includes a body having a body width and a head having a head width greater than the body width.

3. The fan handle of claim 2, wherein the head width is greater than a slot width of the slot to prevent the extension portion from fully being withdrawn from the slot.

4. The fan handle of claim 1, wherein the extension portion is operable to slide within the slot.

5. The fan handle of claim 1, wherein, in the retracted configuration, the first sheet and the second sheet are configured to lay substantially flat on the fan.

6. The fan handle of claim 1, wherein the first sheet and the second sheet are operable to be coupled with the fan such that the fan handle is operable to be retrofit to the fan.

7. A fan comprising:
   a housing having a first side and a second side opposite the first side;
   a first and second fan guard, each coupled to the first side and the second side of the housing respectively; and
   a fan handle coupled with the housing, the fan handle including:
      a first sheet having one or more first apertures operable to receive corresponding one or more fasteners operable to couple the first fan guard with the first side of the fan, wherein the first sheet forms a slot; and
      a second sheet having one or more second apertures operable to receive corresponding one or more fasteners operable to couple the second fan guard with the second side of the fan, wherein the second sheet forms shoulders from which an extension portion extends, wherein the extension portion is operable to be received in the slot of the first sheet, wherein, in a retracted configuration, the first sheet and the second sheet are operable to be substantially flush such that the shoulders abut against the first sheet, wherein, in an extended configuration, the extension portion is partially withdrawn from the slot such that the first sheet and the second sheet are curved and coupled with one another.

8. The fan of claim 7, wherein the extension portion includes a body having a body width and a head having a head width greater than the body width.

9. The fan of claim 8, wherein the head width is greater than a slot width of the slot to prevent the extension portion from fully being withdrawn from the slot.

10. The fan of claim 7, wherein the extension portion is operable to slide within the slot.

11. The fan of claim 7, wherein, in the retracted configuration, the first sheet and the second sheet are configured to lay substantially flat on the housing of the fan.

12. The fan of claim 7, wherein the first sheet and the second sheet are operable to be coupled with the fan such that the fan handle is operable to be retrofit to the fan.

13. The fan of claim 7, wherein, in the extended configuration, the first sheet and the second sheet are curved to form a gap between the housing of the fan and fan handle.

14. A computing system comprising:
a body;
one or more fans disposed in the body, each of the one or more fans including:
a housing having a first side and a second side opposite the first side;
a first and second fan guard, each coupled to the first side and the second side of the housing respectively; and
a fan handle coupled with the housing, the fan handle including:
a first sheet having one or more first apertures operable to receive corresponding one or more fasteners operable to couple the first fan guard with the first side of the fan, wherein the first sheet forms a slot; and
a second sheet having one or more second apertures operable to receive corresponding one or more fasteners operable to couple the second fan guard with the second side of the fan, wherein the second sheet forms shoulders from which an extension portion extends, wherein the extension portion is operable to be received in the slot of the first sheet, wherein, in a retracted configuration, the first sheet and the second sheet are operable to be substantially flush such that the shoulders abut against the first sheet, wherein, in an extended configuration, the extension portion is partially withdrawn from the slot such that the first sheet and the second sheet are curved and coupled with one another.

15. The computing system of claim 14, wherein the extension portion includes a body having a body width and a head having a head width greater than the body width.

16. The computing system of claim 15, wherein the head width is greater than a slot width of the slot to prevent the extension portion from fully being withdrawn from the slot.

17. The computing system of claim 14, wherein the extension portion is operable to slide within the slot.

18. The computing system of claim 14, wherein, in the retracted configuration, the first sheet and the second sheet are configured to lay substantially flat on the housing of the fan.

19. The computing system of claim 14, wherein the first sheet and the second sheet are operable to be coupled with the fan such that the fan handle is operable to be retrofit to the fan.

20. The computing system of claim 14, wherein, in the extended configuration, the first sheet and the second sheet are curved to form a gap between the housing of the fan and fan handle.

* * * * *